(12) United States Patent
Hatamian

(10) Patent No.: US 7,493,354 B2
(45) Date of Patent: Feb. 17, 2009

(54) FIR FILTER TAP ARCHITECTURE FOR HIGHLY DENSE LAYOUT

(75) Inventor: Mehdi Hatamian, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 843 days.

(21) Appl. No.: 10/938,008

(22) Filed: Sep. 10, 2004

(65) Prior Publication Data

US 2005/0055393 A1 Mar. 10, 2005

Related U.S. Application Data

(63) Continuation of application No. 09/771,753, filed on Jan. 29, 2001, now Pat. No. 6,792,440.

(60) Provisional application No. 60/180,579, filed on Feb. 4, 2000.

(51) Int. Cl.
*G06F 17/10* (2006.01)

(52) U.S. Cl. ...................................................... 708/319

(58) Field of Classification Search .................. 708/319
See application file for complete search history.

(56) References Cited

U.S. PATENT DOCUMENTS 5,887,003 A * 3/1999 Ueda .......................... 375/259

* cited by examiner

*Primary Examiner*—David H Malzahn
(74) *Attorney, Agent, or Firm*—McAndrews, Held & Malloy, Ltd.

(57) ABSTRACT

An area-efficient finite impulse response filter having permuted bit-order functional elements that provide substantially straight and direct interconnects with minimized length between adjacent elements. A functional element is coupled with an input data path and an output data path, at least one of which has a permuted bit-order data path exhibiting bit-order ordinal discontinuity. The permuted bit-order data path also can be a transposed permuted bit-order data path in which the placement of at least part of a data path is transposed, relative to prior art placements. The bit-order ordinal discontinuity fosters short, straight element interconnects which leads to increased spatial efficiency and improved performance.

22 Claims, 9 Drawing Sheets

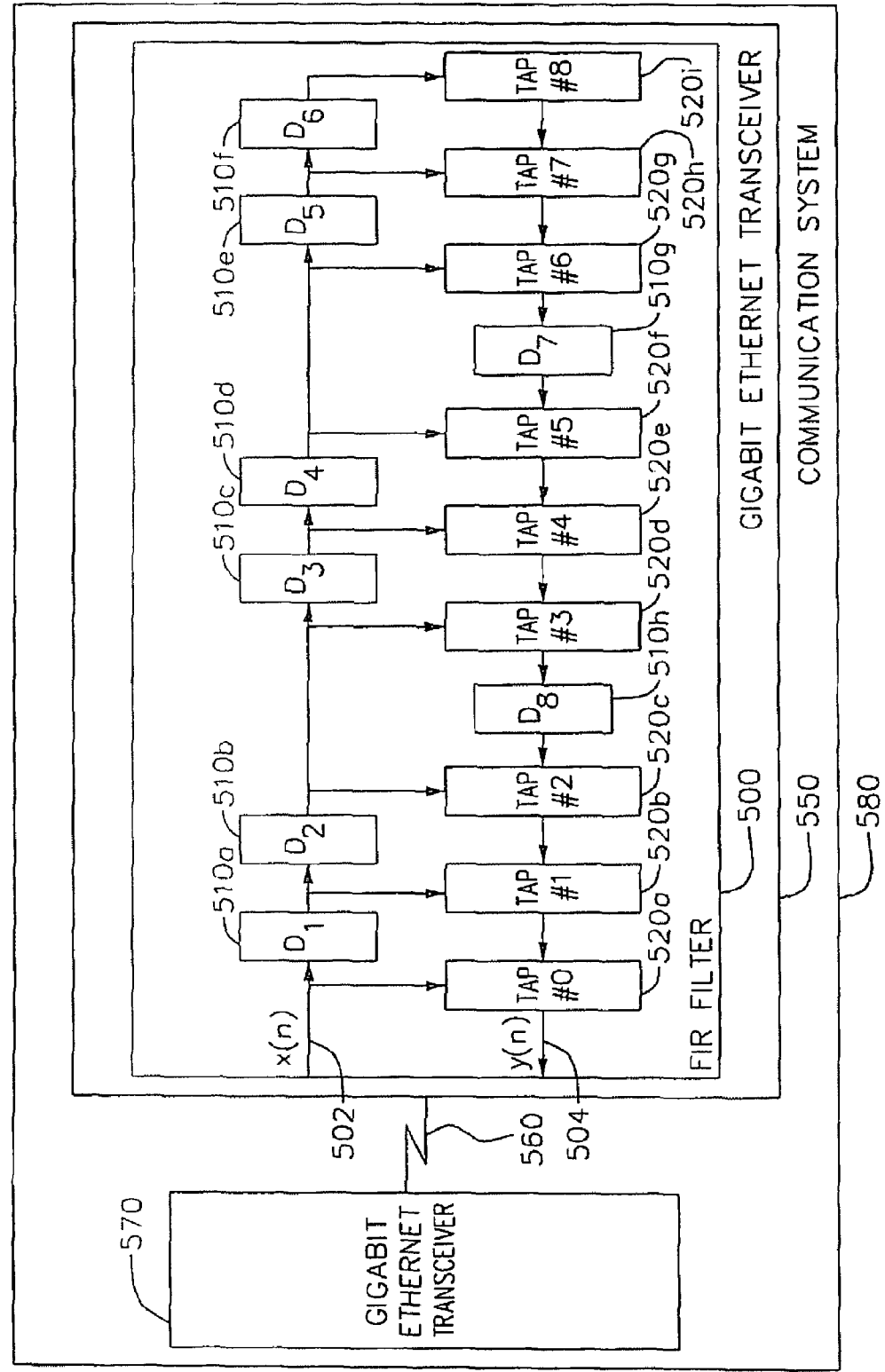

FIR FILTER TAP ARCHITECTURE FOR HIGHLY DENSE LAYOUT

CROSS-REFERENCE TO RELATED APPLICATION(S)

This application is a continuation of U.S. Non-Provisional Patent Application having Ser. No. 09/771,753 filed Jan. 29, 2001, now U.S. Pat. No. 6,792,440 which is based upon and claims the benefit of U.S. Provisional Patent Application having Ser. No. 60/180,579 filed Feb. 4, 2000. The above-identified applications are all hereby incorporated herein by reference in their respective entireties.

BACKGROUND OF THE-INVENTION

1. Field of the Invention

The present invention generally relates to area-efficient digital elements, particularly digital filters, and more particularly, to apparatus and methods for improving spatial efficiency and related performance in finite impulse response (FIR) filters in a high speed communication system.

2. State of the Art

Applications employing high-performance digital signal processing (DSP) techniques are becoming ubiquitous. The implementations of such high-performance digital signal processors, were carried out at the expense of high power consumption and heat dissipation, large die size, and die cost. Many consumer uses, such as personal computers, mass Internet working, portable communication devices, and the like, became feasible as sub-micron VLSI techniques evolved, and were incorporated into DSP processing components. As a result, very high performance DSP devices and systems can be offered in much smaller packages with substantial reductions in power requirements, heat dissipation, cost, and so forth. However, the demand for components in systems having ever-higher speed and precision needs coupled with ever-decreasing cost requirements is unabated. One of the means by which these needs can be met is to integrate what was once a multi-board "system" into a monolithic VLSI chip. Such integration requires many constituent computational modules to be laid out in a compact, dense, efficient chip architecture. A key factor in developing an efficient layout is minimized interconnect routing between the functional elements and modules within a processor.

Typically, as the level of device integration increases, interconnect length can become the one of the most significant factors in determining VLSI system performance. For example, the propagation speed of a signal through an interconnect is dependent upon its length, partly due to the contribution of length to the inherent resistance and capacitance of the interconnect. For global interconnects spanning significant distances of an IC, the effect can be on the order of the square of the interconnect length. On the other hand, local, intra-element interconnects tend to experience propagation delays that are roughly proportional to the interconnect length. Scaling also tends to decrease the power dissipation per gate, which diminishes the ability of a gate to drive the capacitance of an interconnect. Thus, even if a local interconnect is relatively short, inessential length can be highly undesirable.

Even if the impact of an individual, local interconnect may be deemed relatively modest, the vast numbers of local interconnects distributed throughout a highly-integrated, high-speed VLSI system can, in the aggregate, have a significant cumulative reduction in system performance. Thus, interconnect length can be the dominating factor in determining circuit performance. Indeed, despite the benefits derived from deep sub-micron device scaling, it can be difficult to take full advantage of the higher switching speeds inherent in scaled devices when the propagation of signals throughout the IC is impaired by relatively long, indirect interconnects.

Existing approaches intended to effect short metal interconnect routes typically result in irregular structures that do not lend themselves to very compact and dense layouts. Conversely, architectural approaches intended to provide a compact, dense layout usually result in relatively long, indirect interconnect lengths, and can require additional metal layers to implement functional element interconnection.

What is needed is a digital element architecture that realizes a very compact and dense layout using functional elements having regular structure and using direct, minimal interconnects between adjacent functional elements.

SUMMARY OF THE INVENTION

The present invention satisfies the above need by providing a digital element that employs a permuted bit-order functional element, which functional element is adapted to perform a preselected function. The functional element is coupled to the input and output data paths of the digital element, and is disposed such that the bit locations of the data paths are arranged in a predetermined bit-order sequence. The functional element can be adapted to provide a permuted bit-order sequence on selected bit locations of the input data path, or the output data path, or both. The permuted bit-order sequence exhibits a predetermined bit-order ordinal discontinuity, which effects substantially straight and direct interconnects, having minimized length, between adjacent structures, thus creating a very compact and dense functional module layout. The functional element also can be adapted to provide a transposed permuted bit-order sequence on selected bit locations of the input data path, or the output data path, or both. The transposed permuted bit-order sequence exhibits a predetermined bit-order ordinal discontinuity in combination with at least a portion of the data path being transposed, relative to customary data path layouts. A functional element having a transposed permuted bit-order effects substantially straight and direct interconnects, having minimized length, between adjacent structures, thus creating a very compact and dense functional module layout.

The constituent components of one embodiment of a functional element according to the present invention can include, for example, multiple primitive logic units such as an AND device, an OR device, an XOR device, a NAND device, a NOR device, a NEXOR device, an inverter, or combinations thereof, disposed such that the resultant functional element is an electronic device having multiple bit locations arranged in other than ordinal numerical order. Another embodiment of a functional element according to the present invention can include combinations of these elementary functional elements, which perform essential arithmetic, logic, and switching functions. Such embodiments of functional elements can include, without limitation, an accumulator, a multiplier, a divider, an adder, a counter, a shifter, a decoder, a controller, a multiplexer, a storage (e.g., memory) element, a logic array, and combinations thereof.

Preferred embodiments of the present invention contemplate a permuted bit-order accumulator, as well as a permuted bit-order accumulator coupled with a multiplier, using an interconnect that is substantially direct and of minimized length. Additional preferred embodiments of the present invention contemplate a transposed permuted bit-order accumulator, as well as a permuted bit-order accumulator coupled with a multiplier, using an interconnect that is substantially direct and of minimized length. A FIR filter tap module of the present invention can include such an accumulator and multiplier, such that an area-efficient FIR filter results therefrom. Indeed, in one preferred embodiment of the invention herein, an integrated multiplier/accumulator (MAC), is provided.

Furthermore, yet other embodiments of the invention herein include functional elements having even greater complexity, so that the functional elements of the invention herein comprehend a complete hierarchy of components, devices, subsystems, and systems including, without limitation, arithmetic logic units; computational modules; processors, including without limitation, general-purpose and digital signal processors; filter taps modules; FIR filters, including a direct-transposed FIR filter; transceivers, including without limitation, gigabit Ethernet transceivers; and communications systems.

BRIEF DESCRIPTION OF THE DRAWINGS

These and other features, aspects and advantages of the present invention will be more fully understood when considered with respect to the following detailed description, appended claims and accompanying drawings, wherein:

FIG. 4C is a block diagram of the FIR filter tap module floor plan of FIG. 4A, having functional elements disposed with permuted bit order input and output sequences, according to an embodiment of the invention herein;

FIG. 4D is a block diagram of the FIR filter tap module floor plan of FIG. 4B, having functional elements disposed with transposed permuted bit order input and output sequences, according to the invention herein;

FIG. 4E is a block diagram of a digital element having functional elements disposed with a permuted bit order output sequence, according to the invention herein;

FIG. 4F is a block diagram of a digital element having functional elements disposed with permuted bit order input and output sequences, according to the invention herein; and FIG. 5 is a block diagram of a FIR filter according to the present invention, as it is disposed within a gigabit Ethernet transceiver in a communication system.

DETAILED DESCRIPTION OF THE INVENTION

Figure 1:
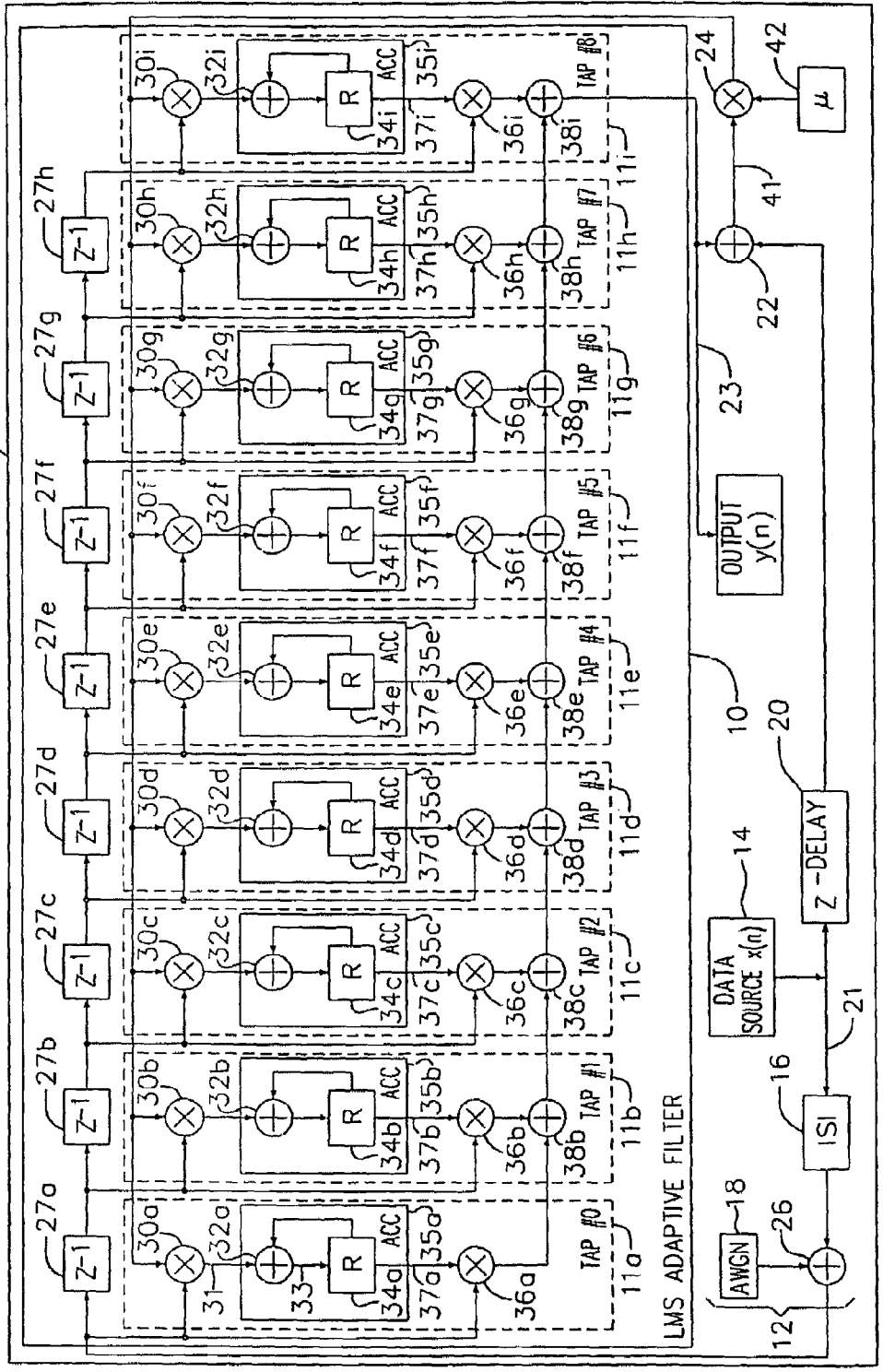
FIG. 1 is a data flow diagram of an exemplary linear transversal filter.

As will be understood by one having skill in the art, most communication systems include digital signal processing (DSP) devices, which are composed of a large number of fundamental components. Such components are repetitively and extensively employed throughout many DSP devices, including, for example, FIR filters. Components which themselves are inefficiently laid out tend to replicate the spatial inefficiency, which ultimately leads to a large VLSI device die size having wasted die area and reduced performance. Furthermore, an inefficient layout having long, angulate interconnect lines can adversely impact the severe power and timing limitations of such high-performance devices. A reduction in the die area consumed by a single component can represent a significant savings in overall die size, due to the replication of the efficiency found within the improved component. Advantageously, such efficiencies in layout typically provide an improvement in device performance, as well.

The present invention is directed to a functional element, the bit locations of which are disposed to provide substantially straight and direct, minimum length interconnects between the functional element and adjacent functional elements, such that the resultant element, device, subsystem, or system, exhibits a dense, efficient layout. As used herein, a "functional element" (or "digital element") can be any element that performs a desired logic function, regardless of the inherent functional complexity. A digital element can include a functional element, and can have input data paths for receiving data, and output data paths for transmitting data after it has been transformed, or delayed, by the functional element. Each functional element can implement a data path using multiple data bit locations on its input and output paths. It is preferred that at least one of the data paths have bit locations arranged in a predetermined bit-order sequence other than an ordinal numerical order. The functional element locations are coupled to the respective digital element input and output data paths. Prior art functional elements are disposed such that the bit-order sequence of the input and output data paths follow a canonical numerical sequence having continuous ordinality e.g., from most significant bit to least significant bit or vice versa. Functional elements according to the present invention are not so constrained.

In general, functional elements according to the present invention can be synthesized by repetitively and selectively interconnecting multiple primitive logic units, for example, AND gates, OR gates, and inverters, and combinations thereof, to provide the desired preselected function. In turn, primitive functional elements can be selectively combined to create more complex digital elements, which themselves may perform more abstract arithmetic, logic, and switching functions than the functions of their constituent elements. A digital element according to the present invention can include, without limitation, an accumulator, a multiplier, a divider, an adder, a counter, a shifter, a decoder, a controller, a multiplexer, a storage (e.g., memory) element, a logic array, and combinations thereof.

Additionally, both a "functional element" and a "digital element" can comprehend sophisticated, composite components, devices, and systems, including without limitation, arithmetic logic units, general purpose processors, digital filters, including constituent filter taps, and digital signal processors, any of which can be used as a building block in a more complex device, subsystem, or system. Indeed, a digital element according to the present invention can be any electronic device having multiple bit locations. The electronic device can include, without limitation, a sequential circuit, combinational circuit, or a combination thereof.

Because a complex digital elements can include many constituent digital and functional elements and components joined by potentially extensive interconnects, it is desirable that constituent elements provide substantially straight and direct, minimum length interconnects between adjacent functional elements and components, such that the resultant element, device, subsystem, or system exhibits a dense, efficient layout.

In general, each of the input and output data paths of a functional element include multiple bit locations, which are arranged in a bit-order sequence having ordinal continuity relative to the bit-significance. For example, a prior art 10-bit data path having such data bit-order with continuous ordinality, an exemplary sequence would be <0 1 2 3 4 5 6 7 8 9>, with each digit representing a particular data bit which may be of increasing significance. Another exemplary sequence would include <9 8 7 6 5 4 3 2 1 0>, in which data bit 9 is followed seriatim by the lesser significant bits. Although more complex digital elements may have much longer bit sequences, any digital element having a permuted bit-order sequence, or a transposed permuted bit-order sequence, on two or more bit locations, is contemplated by the present invention.

A functional element according to the present invention differs from its corresponding canonical bit-ordered form by having the element's bit-order selectively permuted in order to effect substantially straight and direct data paths, or interconnects, having minimized length, between adjacent functional elements. A more complex digital element composed of multiple functional elements, essential digital elements, or both, likewise could benefit from a permuted bit-order sequence or a transposed permuted bit-order sequence, on input data paths, output data paths, any intermediate data paths.

As used herein, a "permuted bit-order" functional element, or digital element, includes any functional or digital element, as defined above, with a data path having a predetermined bit-order ordinal discontinuity. For example, the data path (input, output, or both) of the functional element can be disposed to provide at least two bit locations or data subpaths, whose bit-order is re-grouped such that the length of the interconnect between the permuted bit-order functional element, and an adjacent functional element, is substantially straight and direct, with minimized length. As a result, the adjacent structures, together, occupy a smaller portion of die area than would previously be possible using a canonical bit-order having ordinal continuity. A permuted bit-order sequence can be employed on an input data path, and output data path, or an intermediate interconnect that couples adjacent devices.

Similarly, a "transposed permuted bit-order" functional element, or digital element, includes any functional or digital element, as defined above, with a data path having a predetermined bit-order ordinal discontinuity, with at least a portion of the data path being transposed, relative to a customary bit-order sequence. For example, the data path (input, output, or both) of the functional element can be disposed to provide at least two bit locations or data subpaths, whose bit-order is re-grouped such that the length of the interconnect between the permuted bit-order functional element, and an adjacent component or functional element, is substantially straight and direct, with minimized length. As a result, the adjacent structures, together, occupy a smaller portion of die area than would previously be possible using a canonical bit-order having ordinal continuity. Where feasible to employ, it is possible that a transposed permuted bit-order functional element can provide additional spatial efficiencies in device layout. A transposed permuted bit-order sequence can be employed on an input data path, and output data path, or an intermediate interconnect that couples adjacent devices.

Hereafter, but solely for the purposes of exposition, it will be useful to describe the present invention in terms of an exemplary linear transversal (FIR) filter. LMS adaptive filters are ubiquitous, and thus well known in the art. Skilled artisans would recognize that the present invention is not limited to adaptive filters, or even to digital communication systems, however.

FIG. 1 illustrates a canonical-form FIR filter which, here, is a nine-tap transversal LMS adaptive equalizer 5. Such a filter generally includes a combination of three basic functional elements: storage devices, multipliers, and adders, although other functional elements may be used. These basic functional elements are combined to create composite functional and digital elements, which themselves are repetitively employed through the FIR filter architecture. The functional and digital elements in filter section 10 are coupled by numerous interconnects, each of which are composed of routing wires, the number of which being equivalent to the bit width of the data being communicated between the elements. In a DSP system where time is severely budgeted, the time cost of multiple arithmetic operations, accomplished seriatim, can be significant, making any avoidable delay highly undesirable. Thus, it is advantageous to minimize the length of interconnects wherever possible.

LMS transversal filter section 10 includes multiple filter tap modules 11$a$-$i$, which themselves are composite functional elements composed of the storage elements 27$a$-$h$, 34$a$-$i$, multipliers 30$a$-$i$, 36$a$-$i$; and adders 32$a$-$i$, 38$a$-$i$. Furthermore, accumulators 35$a$-$i$ are composite functional elements that can include storage elements 34$a$-$i$ and adders 32$a$-$i$. It is apparent from FIG. 1 that equalizer 5 is created by the repetitive selective placement of functional elements having preselected functions. Inefficiencies in the interconnects of the primitive, basic, or composite functional elements in equalizer 5 can rapidly lead to inefficiencies in the layout of and the die area of the device, subsystem, or system of which equalizer 5 is a part.

Figure 2A:
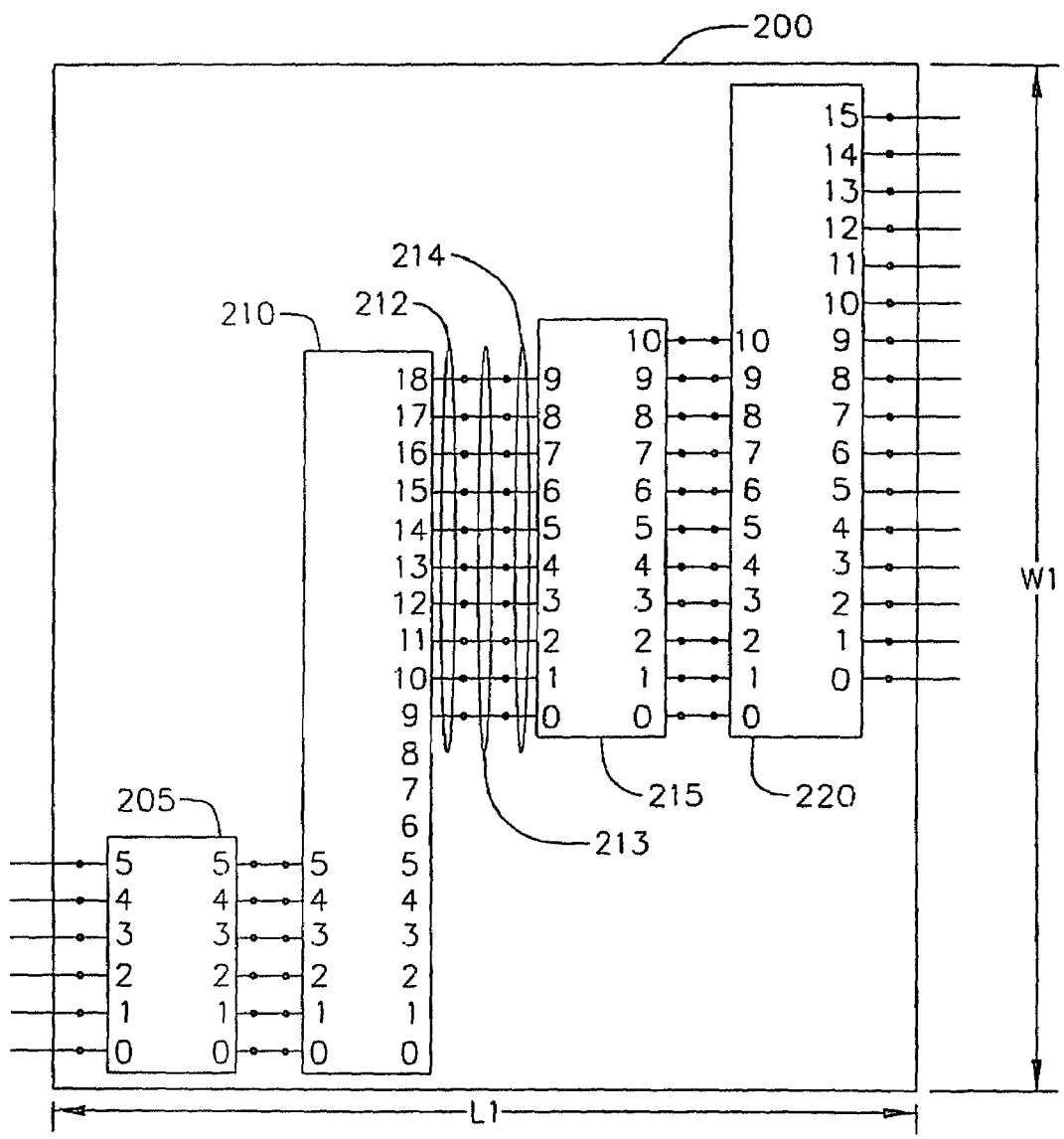
FIG. 2A is an illustration of a exemplary module floor plan having prior art elements therein.
Figure 2B:
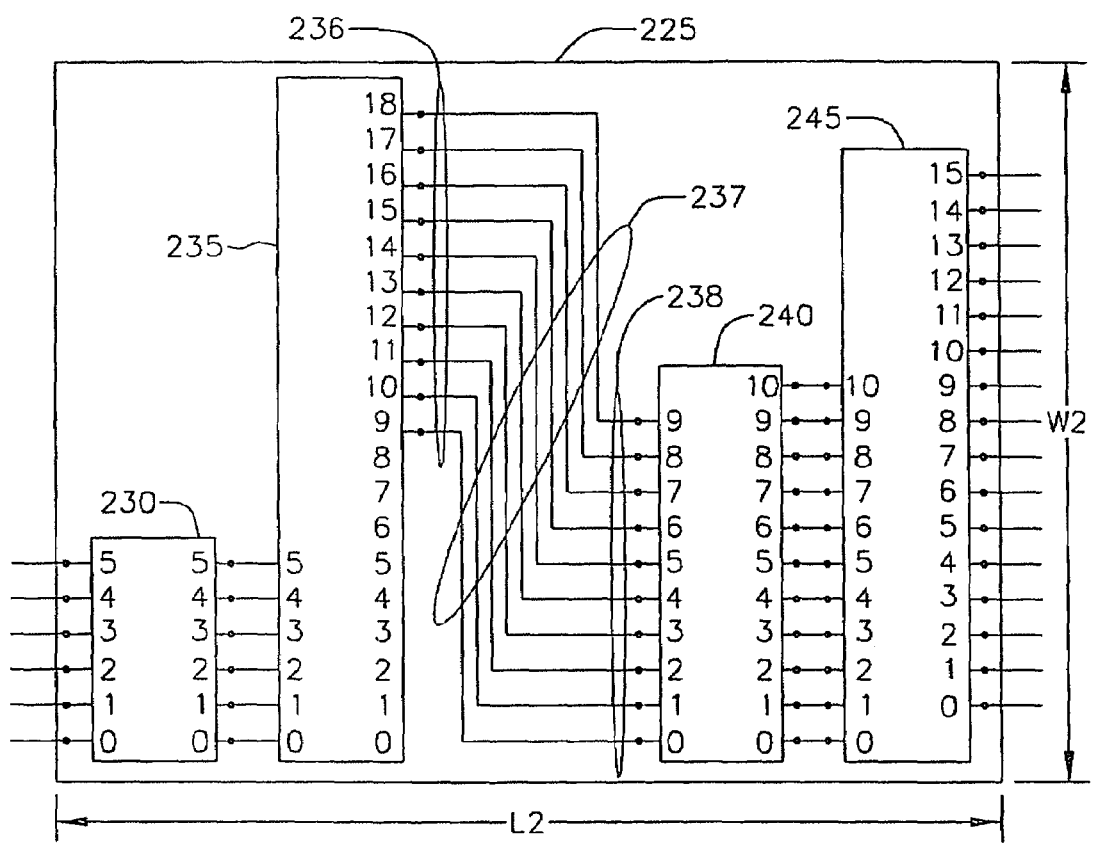
FIG. 2B is an illustration of another exemplary module floor plan, having prior art components therein.

FIGS. 2A and 2B illustrate typical interconnect inefficiencies that are imposed by prior art components 205, 210, 215, 220, of functional module 200 and components 230, 235, 240, 245, of functional module 225, respectively. The respective bit locations of components 205-220 in module 200 and 230-245 in module 225 are arranged with simplicity of the internal device structure in mind, and not with regard to providing short, straight and direct interconnects between adjacent components. In many high-performance devices, particularly where such prior art components are repetitively applied within the device architecture, this simplistic internal structure can create the undesirable effects of inefficient layout, large die size, increased power consumption and capacitance, reduced throughput, and the like.

In the particular example illustrated in FIG. 2A, the input and output data paths of each of components 205, 210, 215, 220 have bit locations which are arranged in bit-order sequence having ordinal continuity. Thus, the canonical ordinally-continuous bit-order sequence for the nineteen-bit output data path 212 of component 210 would be <0 1 2 3 4 5 6 7 8 9 10 11 12 13 14 15 16 17 18> or vice versa. In the exemplary design depicted by FIG. 2A, it is desired to interconnect the most significant ten bit locations (Bits 18-9) of output data path 212 of component 210 with the bit locations of the ten-bit input data path 214 of component 215, using interconnect 213. By forcing interconnect 213 to be short and straight, the length, L1, of module 200 is minimized. However, the short interconnect 213 imposes the expense of increasing the width, W1, and thus the required die area (L1×W1) of module 200.

In FIG. 2B, it also is desired to interconnect the most significant ten bit locations (Bits 18-9) of the output data path 236 of component 235 with the bit locations of the ten-bit input data path 238 of component 240, using interconnect 237. In this example, module width, W2, is minimized by allowing longer, indirect, and angulate interconnects 237 between adjacent components 235 and 240. Although the width, W2, of module 225 is reduced with this design, relative to width W1 of module 200, the longer, indirect interconnects 237 tend to extended module length, L2, thereby increasing the required die area (L2×W2) of module 225. As in FIG. 2A, the bit-order sequence of each component 230, 235, 240, 245 has ordinal continuity enforced.

Figure 2C:
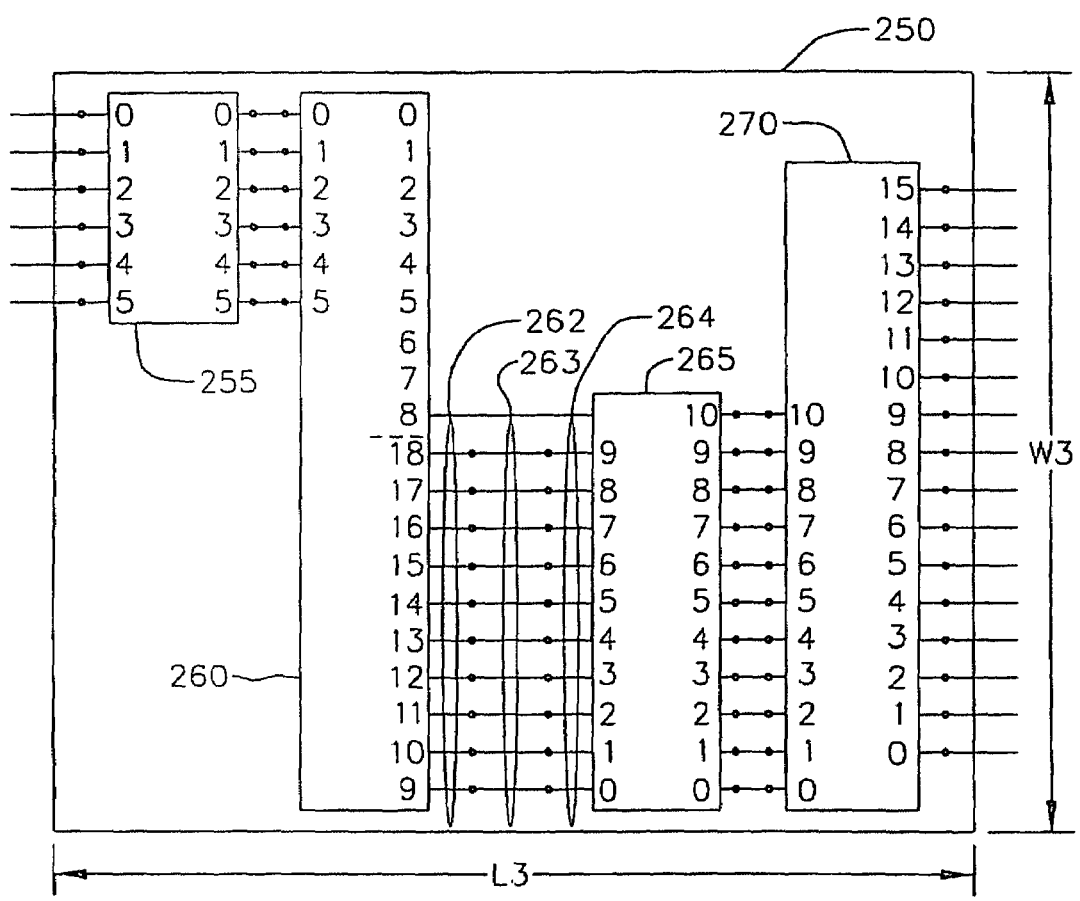
FIG. 2C is an illustration of an exemplary module floor plan, having functional elements according to an embodiment of the invention herein.

By contrast, module 250 in FIG. 2C, minimizes both module length, L3, and module width, W3, by employing functional elements having a permuted bit-order sequence on the bit locations of the input data path, the output data path, or both. In the particular example in FIG. 2C, functional element 260 uses an input data path 259 having six input data path 258 (i.e., bits 0-8) and an output data path 261 having nineteen output data bit path 262. For clarity, the first nine output data bit paths of element 260 are not shown. Similar to the design of FIG. 2B, the design of module 250 in FIG. 2C, complete the most significant ten output data bit path 262 of functional element 260 with the ten input data bit path 264 of functional element 265. However, in accordance with the present invention, functional element 260 is disposed to provide a permuted bit-order sequence, in this case on the output data path of the element. The illustrated permuted bit-order sequence exhibits ordinal discontinuity such that the predetermined data path bit-order does not observe a strict ordinal succession from most significant data bit to least significant data bit, or vice-versa. Instead, the data path bit-order is permuted such that the bit-order sequence provides interconnects 263, which are substantially straight, direct, and of minimized length.

In this particular example, the output data path 262 of functional element 260 has an ordinal discontinuity spanning two data subpaths, with first data subpath (not shown) including the nine least significant bits (i.e., Bits 0-8), and second data subpath including the ten most significant bits (i.e., Bits 9-18). The bit-order permutation of this example is created by disposing the bit locations in functional element 260 such that order of the bits on second data subpath is "reversed" relative to the usual ordinal sequence of elements bits. Thus the data bit paths of functional element 260 follow the sequence <0 1 2 3 4 5 6 7 8 18 17 16 15 14 13 12 11 10 9>, with the ordinal discontinuity occurring after Bit 8. The permuted bit-order second data subpath 262 then is coupled to input data path 264 of adjacent functional element 265 via short, direct interconnects 263. As a result, the required die area (L3×W3) of module 250 is reduced.

Figure 2D:
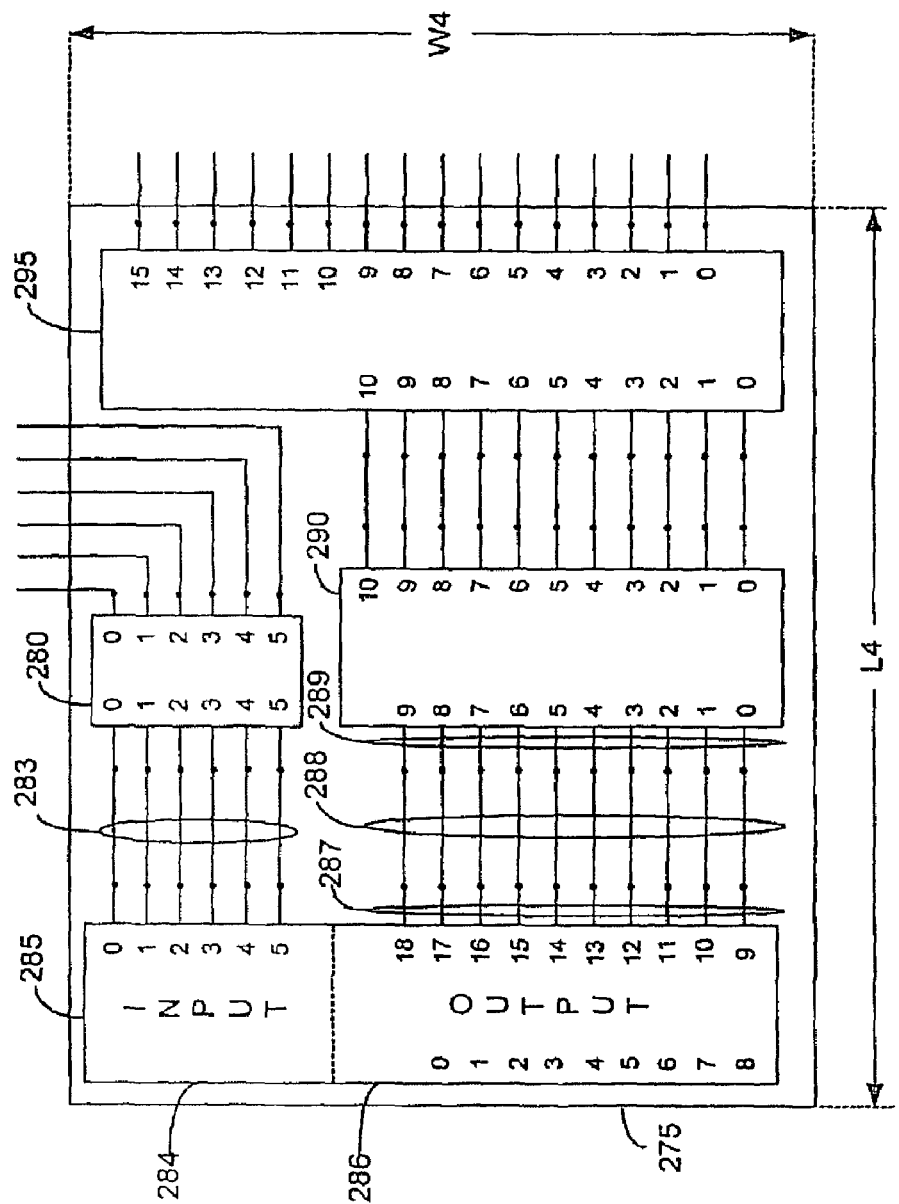
FIG. 2D is an illustration of exemplary module floor plan, having functional elements according to another embodiment of the invention herein.

In FIG. 2D, another preferred embodiment of a permuted bit-order functional element 285 is illustrated within module 275. Although permuted bit-order functional elements were described above in terms of a permuted bit order relative to an input, an output, or both, element 285 discloses a transposed permuted bit-order functional element 285 in which input portion 284 of module is transposed relative to the output portion 286, such that input data path 283 enters element 285 in a defined spatial relationship with output data path 287, represented in FIG. 2D as a vertical spatial relationship. An advantage of the transposed permuted bit order of functional element 285 is that element 280 may be placed in a vertical relationship with functional element 290, thereby increasing the spatial efficiency of module 275 by further reducing the length, L4, of module 275. In yet another embodiment of a transposed permuted bit order functional element 285, it is possible to integrate element 280 directly into the input portion 284 of functional element 285, thus affording even greater spatial efficiencies, where elements 280 and 285 are amenable to such integration. As a result, the required die area (L4×W4) of module 275 is reduced.

A skilled artisan now would recognize that a permuted bit-order functional, or digital, element can have a permuted bit-order sequence on the output data path, the input data path, or both. Also, the data path of a permuted bit-order functional, or digital, element can have two or more data subpaths with two or more ordinal discontinuities in the data bit-order sequence, as may be useful to effect additional short, direct interconnects with other elements. Furthermore, where the bit locations of both input and output data paths are selectively permuted, a different bit sequence permutation can be employed on each of the input data path and the output data path, depending upon the efficiency goals intended by the permutation. Moreover, by providing a transposed permuted bit order sequence, and by placing the input data path in a defined transport spatial relationship with the output data path, a functional element yielding additional efficiencies, including substantial spatial efficiencies, can be devised.

Figure 3:
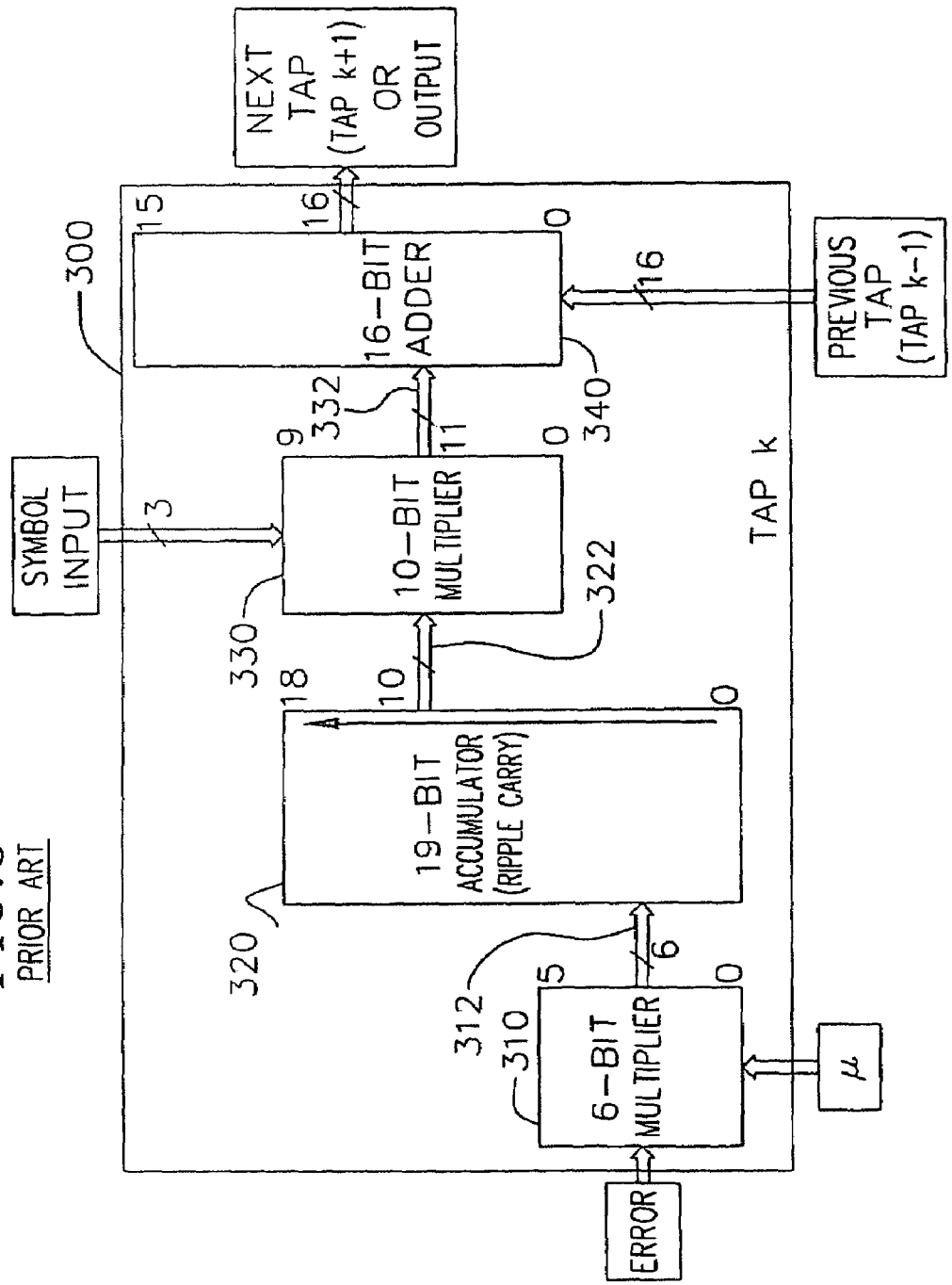
FIG. 3 is a block diagram of a prior art FIR filter tap module floor plan, having prior art components therein.

FIG. 3 illustrates an exemplary prior art digital filter tap module 300 that includes first multiplier 310, ripple carry accumulator 320, second multiplier 330, and adder 340. One design goal of prior art module 300 is to interconnect constituent components 310, 320, 330, 340 to effect minimal routing therebetween, as implemented by interconnects using relatively short, straight metal routing lines 312, 322, 332. The relative efficiency gained by the short, straight metal interconnects of present design technologies comes at the expense of a relatively expansive, irregular device layout. This is similar to the disadvantages illustrated in the example of FIG. 2A. Other present design techniques provide regular structures but at the expense of relatively long interconnect lengths, and/or the need for additional metal layers, similar to the disadvantages described with regard to FIG. 2B.

Heretofore, whether in the design of short metal routes, or in the design of a compact structure, constituent components 310, 320, 330, 340, were provided as devices having bit locations arranged in sequential bit order exhibiting ordinal continuity, i.e., using a canonical numerical order. Canonically-ordered components can hinder the design of module architectures in which it is most desirable to create a compact, regular structure having constituent components coupled by substantially straight interconnects of minimized length. Preferred embodiments of the present invention can effect such desirable module architectures.

Figure 4A:
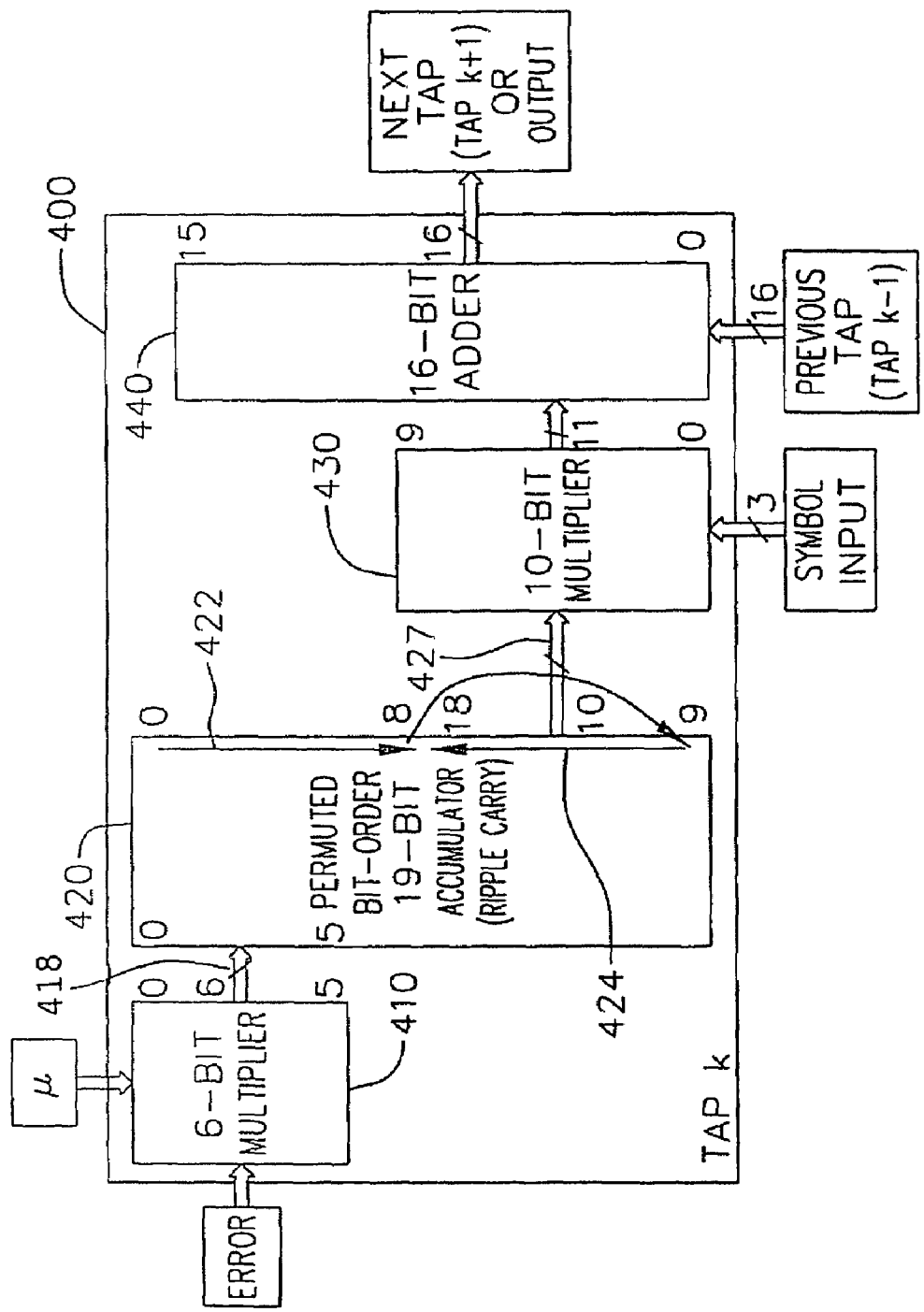
FIG. 4A is a block diagram of a FIR filter tap module floor plan, having functional elements disposed with a permuted bit order sequence, according to an embodiment of the invention herein.

FIG. 4A illustrates one embodiment of the present invention, this time in the form of FIR filter tap module 400. Tap module 400 includes, solely for the purpose of this example, first multiplier 410, accumulator 420, second multiplier 430, and adder 440. In FIG. 4A, accumulator 420 is arranged such that both the design goals of having a compact, regular structure using substantially straight and direct interconnects with minimized length are effected. A skilled artisan would realize that the invention herein is not limited to accumulators, such as accumulator 420, or even to modules such as FIR filter tap module 400, but can be employed in numerous basic and composite functional elements, alone, or in combination with other functional elements, including, without limitation, adders, multipliers, storage elements. More complex digital elements are within the scope of the present invention, including, for example, an arithmetic unit, a general purpose processor, a DSP processor, a gigabit Ethernet system, a communication system, and the like.

In the particular preferred embodiment of the invention shown in FIG. 4A, accumulator 420 can be a ripple carry accumulator of 19-bit length, with permuted bit-order output data subpaths, such that first output data subpath 422 implements nine lower order bit locations (i.e., Bits 0-8), and second output data subpath 424 implements ten upper order bit locations (i.e., Bits 9-18). As a result of employing permuted bit-order accumulator 420, interconnect 427 between accumulator 420 and adjacent multiplier 430 can be accomplished by substantially direct, short metal lines. Exemplary accumulator 420 is arranged with input and output on opposing sides such that data signals generally propagate unidirectionally, e.g., from left to right. Unlike accumulator 320 in FIG. 3, in which enforcement of bit-order ordinal continuity leads to an irregular, and relatively larger, configuration for module 300, permuted bit-order accumulator 420 can have its data subpaths 422, 424 arranged to effect substantially straight and direct interconnects 427 having minimized length. Using the permuted bit-order functional elements of the present invention, the layout of constituent components 410, 420, 430, 440 of filter tap module 400 lend itself to a compact, regular structure that minimizes consumed die area, element interconnect lengths, power consumption, and device latency. Here, the output data path is arranged to be opposite the input data path, relative to the longitudinal axis of element 420. Bit-order discontinuity in exemplary accumulator 420 is provided on the right side, or output data path, although discontinuity also could provide a permuted bit-order on the input data path, or both.

Figure 4B:
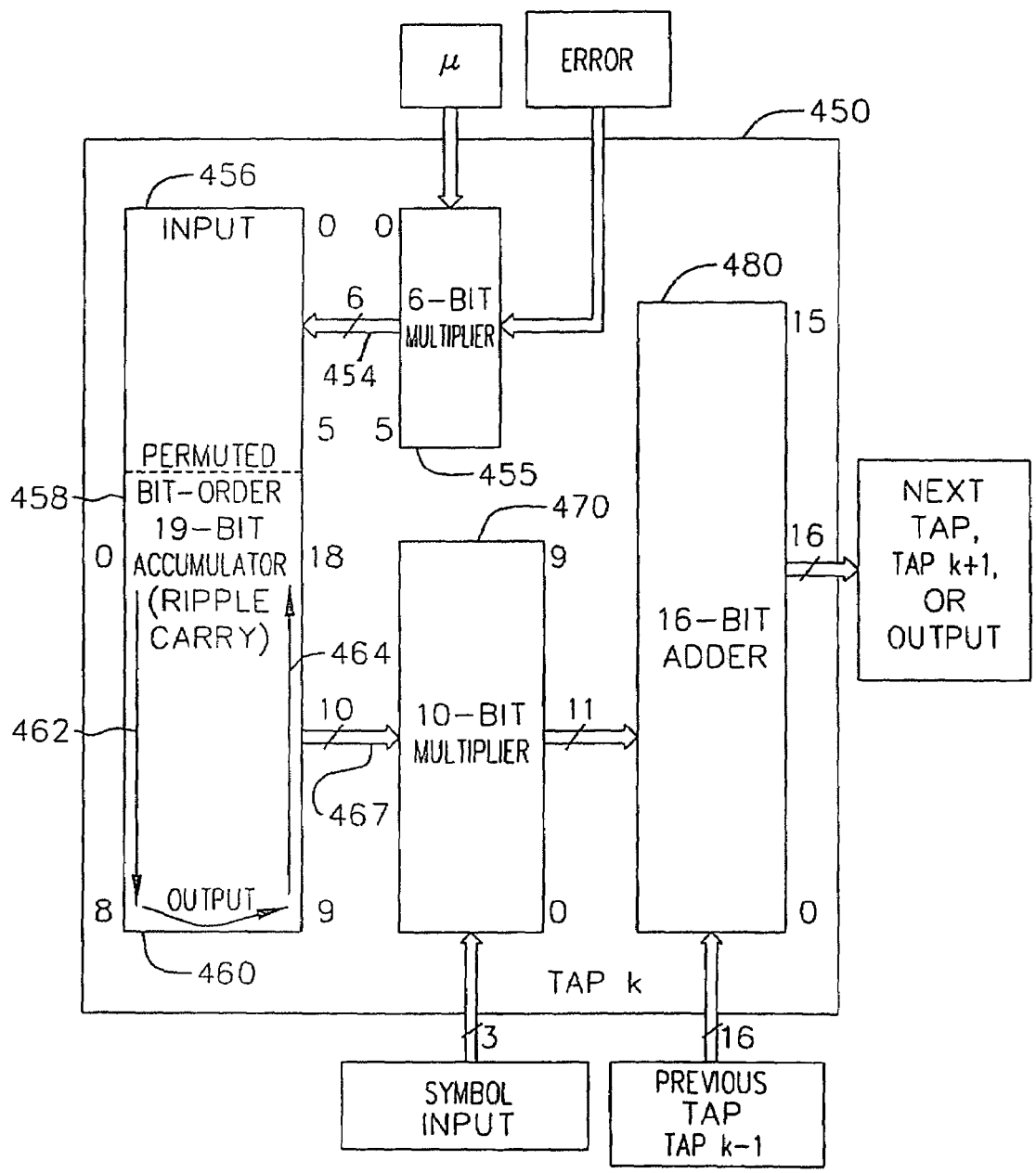
FIG. 4B is a block diagram of a FIR filter tap module floor plan, having functional elements disposed with a transposed permuted bit order sequence, according to the invention herein.

In FIG. 4B, another embodiment of a FIR filter tap module 450 is illustrated, which includes, solely for the purpose of this example, first multiplier 455, accumulator 460, second multiplier 470, and adder 480. In FIG. 4B, accumulator 460 is arranged to have a transposed permuted bit order, similar to functional element 285 in FIG. 2D. Data is received from component 455 by functional element input section 456 via input data path 454, and is transmitted to component 470 from functional element output section 458 via output data path 467. In contrast to the accumulator 420 in FIG. 4A, element 460 in FIG. 4B is arranged such that input data path 454 into input section 456 is disposed on the same side as output data path 464 of output section 458. Relative to the placement of input data path of element 420 in FIG. 4A, input data path 454 of element 460 in FIG. 4B is transposed, relative to a customary input layout, such as in FIG. 4A, for the purpose of providing additional spatial efficiencies in the layout of filter tap module 450. Thus, element 450 is said to have a "transposed permuted bit order sequence."

By employing a transposed permuted bit order design in accumulator 460, multiplier 455 can be placed in a defined spatial relationship with second multiplier 470, and make use of otherwise underutilized device area. The transposed permuted bit order of accumulator 460 can lead to a substantial increase in the spatial efficiency of tap module 450 over prior art modules. Furthermore, due to the spatial efficiencies afforded by the transposed permuted bit order of accumulator 460, it is possible to integrate multiplier with accumulator 460, to provide a transposed permuted bit-order multiplier-accumulator (MAC) 490, which can yield even greater spatial efficiencies in the layout of tap module 450.

In addition to being a advantageously implemented in a tap module, a functional element, as exemplified by accumulator 460, having a permuted bit-order sequence, or a transposed bit order sequence, also can be advantageously implemented in a computational module, and in a processor, including a general purpose processor and a digital signal processor. Indeed, a functional element according to the present invention can be devised and adapted to perform a preselected function in virtually any digital environment.

Referring now to FIG. 4C, there is illustrated a block diagram of the FIR filter tap module 400 floor plan of FIG. 4A, having functional elements disposed with permuted bit order input and output sequences, according to an embodiment of the invention herein. More specifically, the accumulator 420 has a bit-order discontinuity on the output data path (e.g., data subpath 424), as well as a bit-order discontinuity on the input data path 418. The input data path 418 implements six bit locations in the accumulator 420, which receive data from the multiplier 410. The six bit locations of the input data path 418 contain six bits in a permuted bit order.

Referring now to FIG. 4D, there is illustrated a block diagram of the FIR filter tap module 450 floor plan of FIG. 4B, having functional elements disposed with transposed permuted bit order input and output sequences, according to the invention herein. More specifically, the accumulator 460 has a bit-order discontinuity on the output data path 467 (e.g., data subpath 464), as well as a bit-order discontinuity on the input data path 454. The input data path 454 implements six bit locations, which receive data from the multiplier 455. The six bit locations of the input data path 454 contain bits in a permuted bit order.

FIG. 4E is a block diagram of a digital element 480 having functional elements disposed with a permuted bit order output sequence, according to the invention herein. More specifically, the digital element 480 comprises one or more functional elements, for example, functional element 1 (481), functional element 2 (482) and functional element n (483). The input data path 484 may be transposed on the same side as the output data path 486, i.e. input data path 485. The input data bits 487 (and input data bits 489 if the input data path is transposed) may be of continuous ordinality, i.e., the bit order is not permuted. However, the output data bits may comprise a permuted bit order sequence 488. As previously described, a digital element 480 may comprise one or more functional elements, where each functional element may comprise an AND device, an OR device, an XOR device, a NAND device, a NOR device, a NEXOR device, an inverter, an accumulator, a multiplier, a divider, an adder, a counter, a shifter, a decoder, a controller, a multiplexer, a storage element, a logic array, and combinations thereof.

FIG. 4F is a block diagram of a digital element 490 having functional elements disposed with permuted bit order input and output sequences, according to the invention herein. More specifically, the digital element 490 comprises one or more functional elements, for example, functional element 1 (491), functional element 2 (492) and functional element n (493). The input data path 494 may be transposed on the same side as the output data path 496, i.e. input data path 495. The input data bits 497 (and input data bits 499 if the input data path is transposed) may be of permuted bit order. In addition, the output data bits may also comprise a permuted bit order sequence 498. As previously described, a digital element 490 may comprise one or more functional elements, where each functional element may comprise an AND device, an OR device, an XOR device, a NAND device, a NOR device, a NEXOR device, an inverter, an accumulator, a multiplier, a divider, an adder, a counter, a shifter, a decoder, a controller, a multiplexer, a storage element, a logic array, and combinations thereof.

In FIG. 5, another preferred embodiment of the present invention in the form of FIR filter 500 is illustrated, in which the delay elements 510a-h are selectively distributed between the filter input data path 502, and the output data path 504. Structural and operational details of FIR filter 500 are further discussed in U.S. Pat. No. 6,272,173, issued on Aug. 7, 2001, entitled "EFFICIENT FIR FILTER FOR HIGH-SPEED COMMUNICATION", having the same inventor and being assigned to the same assignee hereof, and which hereby is incorporated by reference in its entirety herein. FIR filter 500 can be a direct-transposed FIR filter, which can be a constituent element of a gigabit Ethernet transceiver 550 in communication system 580.

In FIG. 5, filter 500 is an $8^{th}$ order LMS adaptive FIR filter having 9-tap elements 520*a-i*, with 8 delay structures 510*a-h* therebetween. The overall architecture of the FIR filter in FIG. 5 differs from the canonical FIR filter architecture in FIG. 1, in that delay elements 510*a-h* are not located exclusively on the input path 43 as in the direct-form filter 10, but are placed on both input path 502 and output path 504. As explained in U.S. patent application Ser. No. 09/437,722, this distribution of delay elements helps the filter designer balance device element size and power consumption against filter operating speed.

By employing permuted bit-order functional elements in the design of filter 500, for example, accumulator 420 and tap module 400 in FIG. 4, additional efficiencies in the die area, operating characteristics, and performance of filter 500 can be realized. Furthermore, in view of the modular and hierarchical nature of permuted bit-order functional elements, the aforementioned efficiencies afforded by the present invention can be advantageously used in the design of many types of devices, subsystems, and systems. Thus, as illustrated in FIG. 5, filter 500 devised according to the present invention can be a constituent component of gigabit Ethernet transceiver 550. Another embodiment of the present invention contemplates transceiver 550 coupled to a partner transceiver 560 communicating over channel 570, together constituting communication system 580.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A digital element, comprising:
   an input data path having a first plurality of input bit locations arranged in a predetermined input bit-order sequence; and
   a plurality of functional elements adapted to perform at least one preselected function,
   wherein at least one of said plurality of functional elements is coupled to said input data path via a second plurality of input bit locations within said at least one of said plurality of functional elements,
   wherein said second plurality of input bit locations comprises a permuted bit-order sequence within said at least one of said plurality of functional elements, such that an interconnect comprising said input data path and disposed between said first plurality of input bit locations and said second plurality of input bit locations is rendered substantially direct and of minimized length, and
   wherein said at least one of said plurality of functional elements comprises a digital tap filter.

2. A digital element, comprising:
   an input data path having a first plurality of input bit locations arranged in a predetermined input bit-order sequence; and
   a plurality of functional elements adapted to perform at least one preselected function,
   wherein at least one of said plurality of functional elements is coupled to said input data path via a second plurality of input bit locations within said at least one of said plurality of functional elements,
   wherein said second plurality of input bit locations comprises a permuted bit-order sequence within said at least one of said plurality of functional elements, such that an interconnect comprising said input data path and disposed between said first plurality of input bit locations and said second plurality of input bit locations is rendered substantially direct and of minimized length,
   wherein said at least one of said plurality of functional elements comprises one or more of an accumulator, a multiplier, a divider, an adder, a counter, a shifter, a decoder, a controller, a multiplexer, a storage element, and/or a combination thereof, and
   wherein said at least one of said plurality of functional elements comprises a tap filter.

3. The digital element of claim 2, wherein said at least one of said plurality of functional elements comprises a digital filter.

4. The digital element of claim 2, wherein said at least one of said plurality of functional elements comprises a finite impulse response (FIR) filter.

5. The digital element of claim 4, wherein said FIR filter comprises a direct-transposed FIR filter.

6. The digital element of claim 4, wherein said FIR filter is operably disposed in a transceiver.

7. The digital element of claim 4, wherein said FIR filter is operably disposed in a gigabit Ethernet transceiver.

8. A digital element, comprising:
   an input data path;
   an output data path;
   a first component coupled to said input data path;
   a second component coupled to said output data path;
   at least one functional element being adapted to perform at least one preselected function and having a plurality of bit locations;
   a first intermediate interconnect coupling said first component to said at least one functional element; and
   a second intermediate interconnect coupling said second component to said at least one functional element,
   wherein said at least one functional element is adapted to provide one or both of a transposed permuted bit-order sequence and/or a permuted bit-order sequence on a selected portion of said plurality of bit locations coupled to said first intermediate interconnect and said second intermediate interconnect, such that an intermediate data path comprising said first intermediate interconnect and said second intermediate interconnect is rendered substantially direct and of minimized length.

9. The digital element of claim 8, wherein said at least one functional element comprises a plurality of logic units, inputs of selected ones of said plurality of logic units being functional element input bit locations, and outputs of selected others of said plurality of logic units being functional element output bit locations.

10. The digital element of claim 9, wherein one of said plurality of logic units comprises one or more of an AND device, an OR device, a XOR device, a NAND device, a NOR device, a NEXOR device, an inverter and/or a combination thereof.

11. The digital element of claim 8, wherein said at least one functional element comprises one or more of an accumulator, a multiplier, a divider, an adder, a counter, a shifter, a decoder, a controller, a multiplexer, a storage element, and/or a combination thereof.

12. The digital element of claim 8, wherein said at least one functional element is operably disposed in one of a computational module and an arithmetic logic unit.

13. The digital element of claim 8, wherein said at least one functional element is operably disposed in a processor.

14. The digital element of claim 13, wherein said processor is a general purpose processor.

15. The digital element of claim 13, wherein said processor is a digital signal processor.

16. The digital element of claim 8, wherein said first component comprises a multiplier, said at least one functional element comprises an accumulator, and said second component comprises a multiplier.

17. The digital element of claim 8, wherein said at least one functional element is operably disposed in a digital tap filter.

18. The digital element of claim 17, wherein said digital tap filter is operably disposed in a finite impulse response (FIR) filter.

19. The digital element of claim 18, wherein said FIR filter is operably disposed in a transceiver.

20. The digital element of claim 19, wherein said transceiver is operably disposed in a communication system 21. The digital element of claim 19, wherein said transceiver comprises an Ethernet transceiver.

22. The digital element of claim 21, wherein said Ethernet transceiver comprises a gigabit Ethernet transceiver.

* * * * *